United States Patent [19]
Obata et al.

[11] Patent Number: 5,256,903
[45] Date of Patent: Oct. 26, 1993

[54] PLASTIC ENCAPSULATED SEMICONDUCTOR DEVICE

[75] Inventors: Maya Obata, Ishioka; Asao Nishimura, Ushiku; Makoto Kitano, Tsuchiura; Akihiro Yaguchi, Niihari; Ryuji Kohno, Niihari; Nae Yoneda, Niihari; Ichiro Anjoh, Koganei; Gen Murakami, Tama, all of Japan

[73] Assignee: Hitachi Ltd., Tokyo, Japan

[21] Appl. No.: 797,964

[22] Filed: Nov. 26, 1991

Related U.S. Application Data

[63] Continuation-in-part of Ser. No. 662,617, Feb. 27, 1991.

[30] Foreign Application Priority Data

Feb. 28, 1990 [JP] Japan .................................. 2-045412
Nov. 28, 1990 [JP] Japan .................................. 2-326332

[51] Int. Cl.$^5$ ........................................... H01L 23/30
[52] U.S. Cl. ................................. 257/787; 257/783; 257/782; 257/676
[58] Field of Search ............................ 357/72, 74, 70; 257/783, 782, 676

[56] References Cited

U.S. PATENT DOCUMENTS

4,514,750 4/1985 Adams .................................. 357/70
4,796,078 1/1989 Phelps, Jr. et al. .................. 357/70

FOREIGN PATENT DOCUMENTS

62-150859 7/1987 Japan .
2-50431 2/1990 Japan .
2-144946 6/1990 Japan .

Primary Examiner—Eugene R. LaRoche
Assistant Examiner—Viet Q. Nguyen
Attorney, Agent, or Firm—Antonelli, Terry, Stout & Kraus

[57] ABSTRACT

A plastic encapsulated semiconductor device containing one or more of insulating films. Uneven surfaces, such as recesses and roughened surfaces, are strategically provided on peripheral side (edge) surfaces of the insulating films. As a result, therefore, an interface separation does not easily occur between the side surfaces of the insulating films and the encapsulating resin. If such an interface separation should occur, it cannot develop easily. Thus, it is possible to obtain a plastic encapsulated semiconductor device of a high level of reliability even when the largest possible semiconductor element is mounted therein within limited outside dimensions.

15 Claims, 6 Drawing Sheets

PLASTIC ENCAPSULATED SEMICONDUCTOR DEVICE

CROSS REFERENCE TO RELATED APPLICATION

This is a CIP of our U.S. application Ser. No. 07/662,617, filed on Feb. 27, 1991, pending the disclosure of which is hereby incorporated by reference.

BACKGROUND OF THE INVENTION

This invention relates to a plastic encapsulated semiconductor device and, in particular, to a plastic encapsulated semiconductor device which allows to mount the largest semiconductor element (for example, a semiconductor chip) possible within limited outside dimensions and which is suitable for preventing generation of resin cracks.

In conventional plastic encapsulated semiconductor devices, a structure has been employed in which the semiconductor element (or chip) is fastened to an element (or chip) mounting section called a tab and a plurality of leads are provided around this tab and terminals provided on the semiconductor element are electrically connected to these leads through metal wires and the components thus connected together are sealingly molded by resin.

Nowadays, the size of the semiconductor element (or chip) is gradually increasing as its degree of integration becomes higher, whereas the outside dimensions of the semiconductor device, in which this element is to be mounted, cannot be increased at will due to the requirements for high-density mounting or the tendency is rather toward a decrease in its size. Thus, if the size of the semiconductor element is increased, with the outside dimensions of the semiconductor device remaining unchanged, the conventional semiconductor-device structure in which the semiconductor element is mounted on a tab develops a problem in which the length of a portion for connecting the leads with therein becomes insufficient, so that the leads cannot be secured in position with sufficient fixing strength.

As a means for avoiding this problem, a structure as shown in FIG. 10 is disclosed in Japanese Patent Unexamined Publication No. 61-241959. In this known structure, two insulating films 2 are glued to the circuit-forming surface of a semiconductor element 1, and two common leads 3a for electrical connection are respectively attached to the two insulating films 2 at positions in the vicinity of the inner ends of the films so as to be opposed to each other. Further, signal leads 3b are attached to the insulating films 2 at positions spaced away from the common leads 3a, with the common leads 3a and the signal leads 3b being connected to the semiconductor element 1 through metal wires 4. This type of structure is generally referred to as the "lead-on-chip structure". In another known structure using no tab, which has been proposed, likewise, as a means of avoiding the above problem, a surface of the semiconductor element 1 which is reverse to the circuit forming surface, is attached to the leads 3. The structure is the reverse of the lead-on-chip structure and is referred to as the "chip-on-lead structure". An example of the chip-on-lead structure is disclosed in Japanese Patent Unexamined Publication No. 61-258458.

First, a problem in the prior art will be discussed with reference to the lead-on-chip structure.

Generally, a high molecule material such as polyimide is used as a base material of the insulating film. The base material has a poor adhesive to the encapsulating plastic. It is necessary for the circuit forming surface of the semiconductor element to be electrically connected to the leads by the metal wires. In view of this, the provision of the insulating film is effected only partially, that is, the film is glued only to those sections of the element where they are needed.

In a plastic encapsulated semiconductor device, the respective coefficients of linear expansion of the semiconductor element, leads, insulating film, and encapsulating resin which constitute the device, are usually different from each other, so that any temperature change in the device may cause thermal stress therein. This difference in coefficient of linear expansion is particularly large between the insulating films and the encapsulating resin. Thus, combined with the poor adhesiveness as mentioned above, the interface between these two components is particularly subject to separation, which is easily caused by any thermal stress in the device. When an interface separation occurs between the insulating film and the encapsulating resin, a high stress is generated in the upper end sections of the insulating film portions, causing resin cracks in those end sections.

FIG. 9 schematically shows a resin crack generation mechanism. In this example, crack generation is caused as a result of cooling after plastic encapsulation of the semiconductor device and decrease in temperature at the time of temperature cycle test. As stated above, the coefficients of linear expansion of the device components are different. In the device section above the semiconductor element 1, this difference in the coefficients of linear expansion causes the encapsulating resin 5, which would normally contract as a result of cooling, to be pulled by the semiconductor element 1, with the result that the outer edge surfaces 2c of the insulating film portions are separated from the resin 5, as indicated at 7. As a result of this separation, a stress concentration occurs in the upper end sections of the insulating film portions, thereby causing resin cracks 8b. This also applies to the sections where leads are positioned near the edge surfaces of the insulating film portions. That is, when, in FIG. 9, an interface separation as indicated at 7 occurs between the resin 5 and the inner edge surface 2b of the insulating film portions, this separation also develops in the interfaces between the edge surfaces of the common leads 3a and the encapsulating resin 5, with the result that a concentration of stress occurs in the upper end sections of the common leads 3a, thereby causing resin cracks 8a there.

Generally, the generation of resin cracks not only impairs the sealing property and appearance of the semiconductor device, but, in the case where cracks 8a are generated at the upper end sections of the common leads 3a, causes disconnection of the metal wires 4, which electrically connect the common leads 3a or the signal leads 3b to the semiconductor element 1.

The above problem, which has been described with reference to the lead-on-chip structure, also applies to other types of plastic encapsulated semiconductor devices using insulating films.

SUMMARY OF THE INVENTION

It is an object of this invention to provide a plastic encapsulated semiconductor device which can avoid resin crack generation and which allows mounting the largest possible semiconductor element within limited outside dimensions.

The above object can be achieved by providing means for preventing the generation or development of an interface separation between the end sections of the insulating members (e.g., film) and the encapsulating resin. More specifically, the above object can be achieved by providing uneven surfaces, such as recessed surfaces on the peripheral side surfaces of the insulating members.

In a first aspect of this invention, there is provided a plastic encapsulated semiconductor device comprising: a semiconductor element (or chip); a plurality of leads electrically connected with the semiconductor element; one or more insulating members attached to the semiconductor element and/or the leads; and an encapsulating resin covering a part of the leads, the insulating members and the semiconductor element; wherein at least a part of side surfaces (e.g., peripheral edge surfaces) of the insulating members includes uneven surfaces, such as recessed surfaces.

In another aspect of this invention, there is provided a plastic encapsulated semiconductor device comprising: a semiconductor element (or chip); a plurality of leads electrically connected with the semiconductor element; one or more insulating members provided between the semiconductor element and the leads; an encapsulating resin covering a part of the leads, the insulating members and the semiconductor element; wherein at least a part of side surfaces (e.g., peripheral edge surfaces) of the insulating members includes uneven surfaces such as recessed surfaces.

In still another aspect of this invention, there is provided a plastic encapsulated semiconductor device comprising: a semiconductor element (or chip); at least two insulating members glued to a circuit forming surface of the semiconductor element; first leads for electrical connection with the semiconductor element respectively arranged on the insulating members so as to extend along edge surfaces of the insulating members and so as to be opposed to each other; a plurality of second leads arranged at positions spaced away from the first leads; an encapsulating resin covering a part of the first and second leads, the semiconductor element and the insulating members; wherein at least a part of side surfaces of the insulating members includes uneven surfaces, such as recessed surfaces.

In the above-described plastic encapsulated semiconductor device, it is expedient to provide the uneven portions on at least a part of that insulating-member side surface which is situated near one of the first leads and opposed to the other first lead.

In a further aspect of this invention, there is provided a plastic encapsulated semiconductor device comprising: a semiconductor element (or chip); one or more of insulating members glued to a lower surface of the semiconductor element; a plurality of leads electrically connected with the semiconductor element and extending to a lower surface of the insulating member; and an encapsulating resin encasing a part of the leads, the insulating members and the semiconductor element; wherein at least a part of side surfaces of said insulating members includes uneven surfaces, such as recessed.

In a still further aspect of this invention, there is provided a plastic encapsulated semiconductor device comprising: a semiconductor element (or chip); one or more of insulating members glued to a lower surface of the semiconductor element; a plurality of leads electrically connected with the semiconductor element and extending to an upper surface of the insulating members; and an encapsulating resin encasing a part of the leads, the insulating members and the semiconductor element; wherein at least a part of side surfaces of said insulating members includes uneven surfaces, such as recessed surfaces.

In a still further aspect of this invention, there is provided a plastic encapsulated semiconductor device comprising: a semiconductor element (or chip); a tab on which the semiconductor element is mounted; a plurality of leads arranged around the tab and electrically connected with the semiconductor element; one or more of insulating members glued in common to a plurality of the leads; and an encapsulating resin encasing a part of the leads, the tab, the insulating members and the semiconductor element; wherein at least a part of side surfaces of said insulating members includes uneven surfaces, such as recessed surfaces.

In the plastic encapsulated semiconductor device described above, it is expedient to make the width of an outer opening of each of concave portions of the uneven portions smaller than that of an inner section thereof. Further, the uneven portions can be pear-skin surfaced, i.e. have roughened surface. Further, it is expedient to round the concave portions of the uneven portions formed on the insulating members.

By providing the uneven surfaces on the peripheral side surfaces of the insulating members (e.g., films), as described above, the stress acting on the interfaces between the film-side surfaces and the encapsulating resin is dispersed, thereby preventing an interface separation from being easily generated between the insulating films and the encapsulating resin.

If an interface separation should occur, it cannot develop over a wide range along the side surfaces of the insulating films. That is, the separation is restrained to a minimum, so that the generation of resin cracks can be avoided. Thus, it is possible to obtain a plastic encapsulated semiconductor device of a high level of reliability even when a large-sized semi-conductor element (or chip) is mounted thereon.

BRIEF DESCRIPTION OF THE DRAWINGS

FIGS. 6 to 8 are views showing embodiments of this invention as applied to plastic encapsulated semiconductor devices having structures other than the lead-on-chip and the chip-on-lead type ones, of which:

FIGS. 6 and 7 are sectional views of such plastic encapsulated semiconductor devices; and FIG. 8 is a partially cutaway perspective view of such a semiconductor device;

DESCRIPTION OF THE PREFERRED EMBODIMENTS

Figure 1:
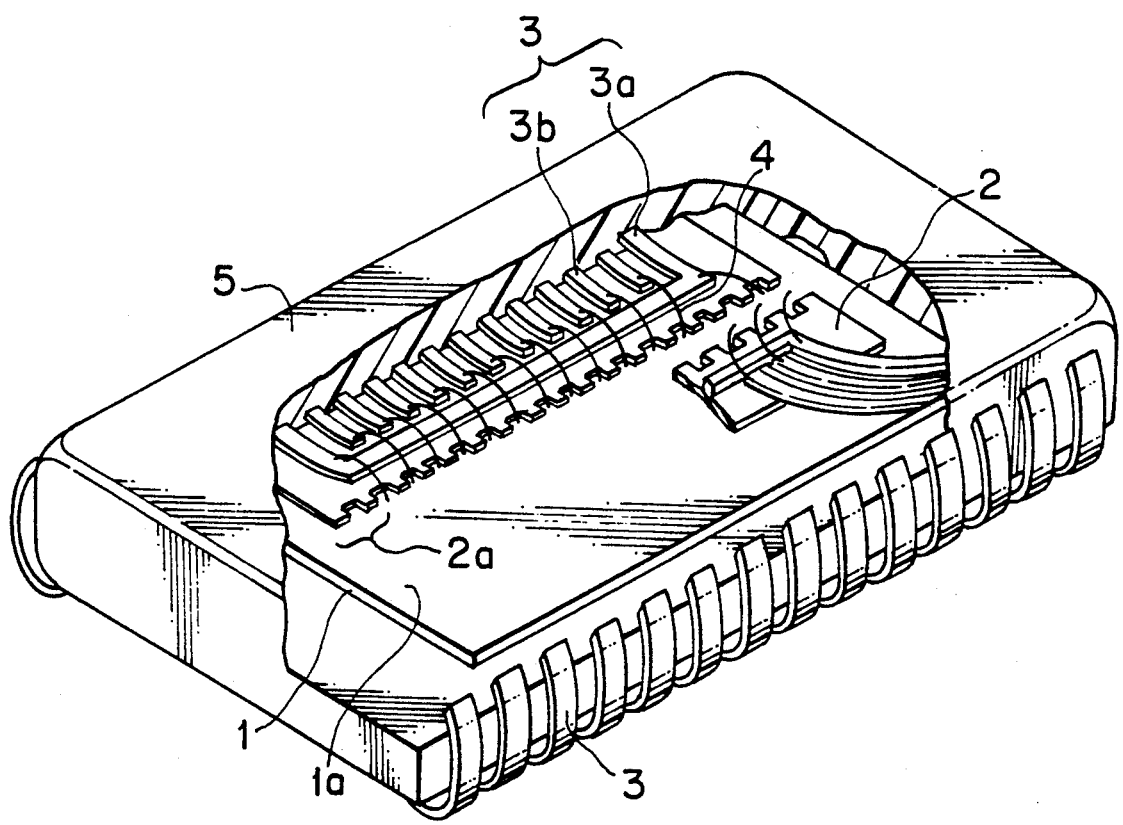
FIG. 1 is a partially cutaway perspective view of a lead-on-chip-type plastic encapsulated semi-conductor device in accordance with an embodiment of this invention.

Embodiments of this invention will now be described with reference to the accompanying drawings FIG. 1 is a partially cutaway perspective view of a lead-on-chip type plastic encapsulated semiconductor device in accordance with an embodiment of this invention. The device shown includes a rectangular semi-conductor element (or chip) 1 and two common leads 3a. These common leads extend in a central portion of the semiconductor element 1 parallel to longer sides thereof i.e., the longer edges or longer edge surfaces of the semiconductor element (or chip), and are electrically connected to the circuit forming surface 1a of the semiconductor element 1 by means of electric wires 4. The respective principal portions of the two common leads 3a are opposed to each other i.e., they are respectively extended facing each other in a direction parallel to the longer edge surfaces. While a greater part of the circuit forming surface 1a is typically covered with a protective layer such as a passivation film formed of, for example a polyimide film, those sections of the surface where the electrical connection is effected are covered with no such passivation film, with the corresponding portions of the circuit forming surface being exposed. The semiconductor device further includes signal leads 3b, which are arranged across one of the sides of the semiconductor element 1 and extend to the central portion thereof. Tips of these signal leads (for example, the front end parts of the inner lead portions) are connected to the semiconductor element 1 on the circuit forming surface 1a thereof by means of metal wires 4. Each lead, for purposes of explanation, consists of an inner lead portion, corresponding to that part thereof embedded within the encapsulating resin 5, and an outer lead portion, contiguous with the inner lead portion and extending outwardly from the encapsulating resin.

Provided between the lower surfaces of the common leads 3a and of the signal leads 3b and the circuit forming surface 1a of the semiconductor element 1 are insulating films 2 of polyimide for electrically isolating the common leads 3a and the signal leads 3b from the semiconductor element 1. Uneven surfaces, such as recessed surfaces 2a are provided on inner sides of the two insulating films 2, i.e., on their inner side (or edge) surfaces extending in a direction parallel to the principal portions of the common leads 3a. These uneven portions may be formed before gluing the insulating films 2 to the semiconductor element 1, by performing etching or punching on their corresponding edge sections. Or, alternatively, it is possible to form these uneven portions by an appropriate etching after gluing the insulating films 2 to the semiconductor element 1.

In accordance with this embodiment, stress acting on interfaces between the inner side surfaces of the insulating films 2 and the encapsulating resin 5 is dispersed, so that an interface separation cannot easily occur between the inner side surfaces of the insulating films 2 and the encapsulating resin 5. If such an interface separation should occur, it cannot develop over a wide range along the side surfaces e.g., peripheral edge surfaces of the insulating films, so that the generation of resin cracks in the outer upper sections of the common leads can be prevented. It is not necessary for the uneven portions to be provided over the entire length of the film sides (e.g., peripheral edge surfaces) but they may be provided only in the central portions of these sides, because in a semiconductor device of this type, cracks are liable to occur at these central side portions, particularly.

As a material for the insulating film, other than a high molecule material such as polyimide and epoxy, an impregnated material such as glass cloth may be used. Further, a similar effect may be obtained with a plastic plate or a ceramic plate previously formed.

Figure 2:
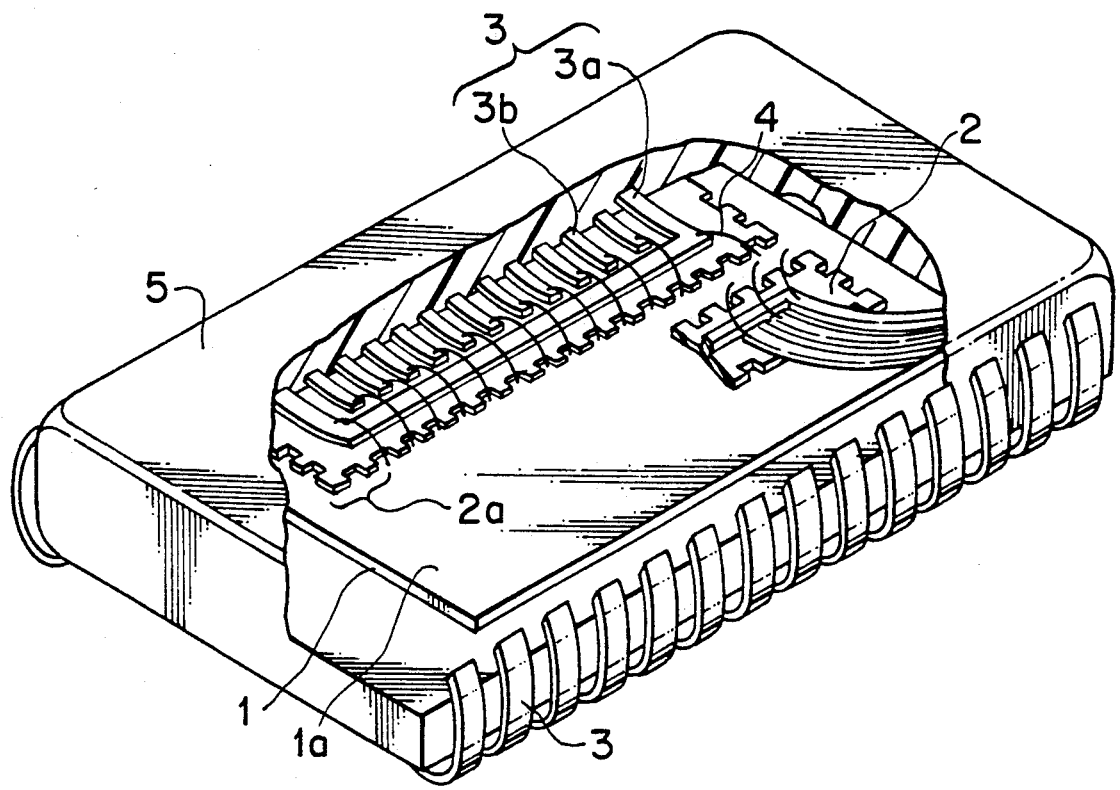
FIG. 2 is a partially cutaway perspective view of a lead-on-chip-type plastic encapsulated semi-conductor device in accordance with another embodiment of this invention.

FIG. 2 is a partially cutaway perspective view of a lead-on-chip-type plastic encapsulated semiconductor device in accordance with another embodiment of this invention. This embodiment is the same as that of FIG. 1 except for the configuration of the insulating films 2. In this embodiment, the uneven portions 2a are provided over the entire peripheral sides of the insulating films 2. In accordance with this embodiment, not only the resin crack generation from the common leads 3a but also that in the film end sections can be prevented.

The provision of the uneven portions 2a is not limited to the inner side surfaces or the entire peripheral sides of the insulating films, as shown in FIG. 1 or 2. Side surfaces directed in a particular direction where crack generation may be involved may be entirely or partially provided with uneven portions. Further, the number of insulating films is not limited to two. It may also be one or more than two depending on the configuration, specifications, etc. of the semiconductor device 1 and the leads 3. In any case, the uneven portions 2a may be provided in the entire peripheral sides of the insulating films or only in those sections which are particularly subject to crack generation, as in the case where two insulating films are used.

Figure 3:
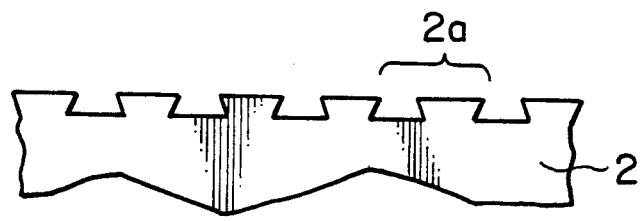
FIGS. 3 and 4A to 4F are diagrams showing other configurations that may be imparted to the insulating films of the embodiments shown in FIGS. 1 and 2.
Figure 4A:
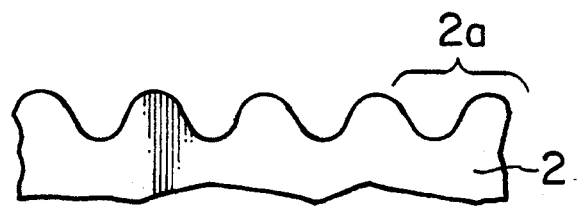
Figure 4B:
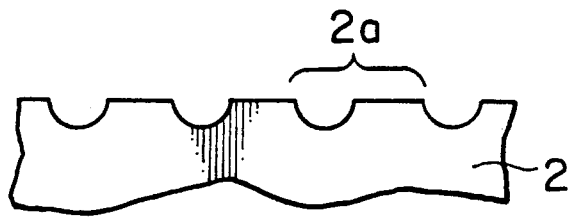
Figure 4C:
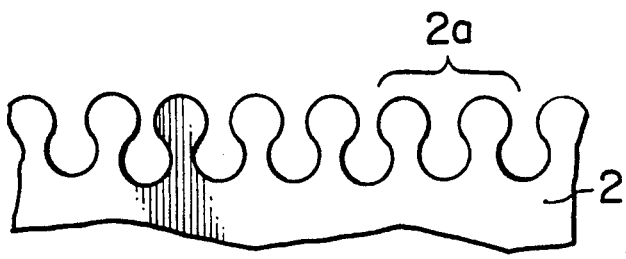
Figure 4D:
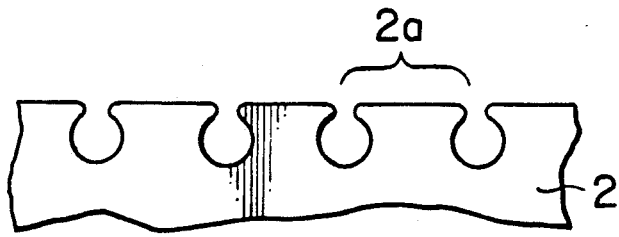
Figure 4E:
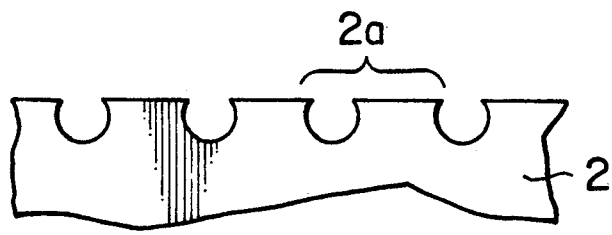
Figure 4F:
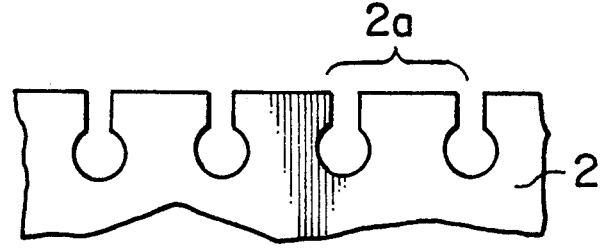

The configuration of the uneven surfaces, such as recessed surfaces 2a provided in the side surfaces of the insulating films 2 is not limited to the rectangular one shown in FIGS. 1 and 2. It may also be trapezoidal—like in shape, as shown in FIG. 3. In that case, it is expedient to make the width at the outer opening of each recess of the uneven portions smaller than the width of the bottom section thereof, as shown in FIG. 3. In accordance with such a configuration for the recesses, the insulating films can be glued to the encapsulating resin more firmly, thereby preventing resin crack generation more effectively.

Further, as shown in FIGS. 4a to 4f, the configuration of the uneven surfaces, such as recessed surfaces may also be a sinewave-like or an arc-segment-like one, or else, a combination of arc segments and straight lines. Rounding each recess of the uneven portions of the insulating film 2, as in the case of the examples shown in FIGS. 4a to 4f, is advantageous in that the films are protected against being torn off at the recesses. As in the case of FIG. 3, making the width at the outer opening of each recess smaller than the width of the inner section thereof, as shown in FIGS. 4c to 4f, proves more effective in preventing the generation of resin cracks.

Regarding the positional relationship between the uneven portions of the side surfaces of the insulating films and the lead wiring pattern may be such that those film sections where the leads exist are convex, or, alternatively, those film sections may be concave. Further, the arrangement of the uneven portions may have nothing to do with the wiring pattern. It is not necessary for the uneven portions to be arranged at regular intervals.

Further, instead of imparting uneven portions to side sections of the insulating films, as shown in FIGS. 1 to 4, it is also possible to roughen the side surfaces (e.g. peripheral edge surfaces) of the insulating films to be pear-skin surfaces (with a random surface roughness of approx. 1 to 100 μm). This arrangement also makes it possible to prevent an interface separation and resin crack generation. Further, the uneven portions need not be arranged in regular patterns.

Figure 5:
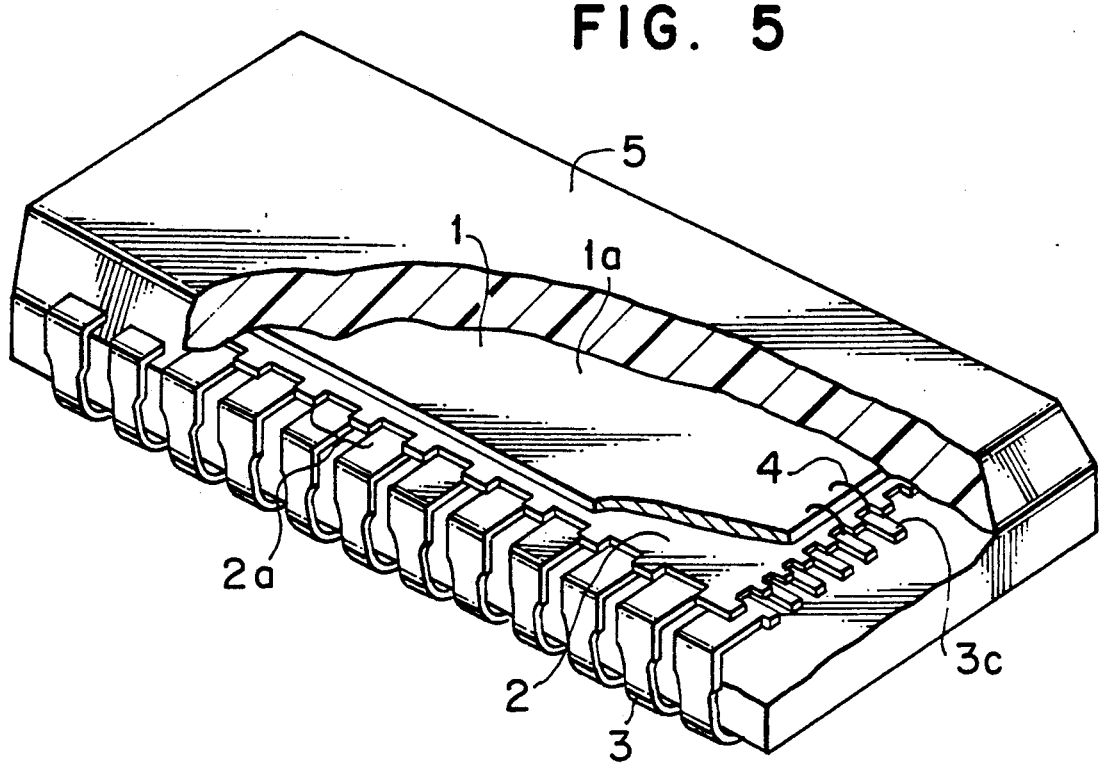
FIG. 5 is a partially cutaway perspective view of a chip-on-lead-type plastic encapsulated semi-conductor device in accordance with an embodiment of this invention.

FIG. 5 is a partially cutaway perspective view of an embodiment of this invention applied to a chip-on-lead-type plastic encapsulated semiconductor device. In this embodiment, the semiconductor element (or chips) 1 is mounted on the leads 3 through the insulating film 2. The circuit forming surface 1a of the semiconductor element 1 is directed upwards, i.e., in the direction opposite to the leads 3, and is electrically connected to the tips 3c, i.e., the front ends of the inner lead portions, of the leads 3 through metal wires 4. As in the case of the lead-on-chip type devices, uneven portions 2a are provided in the side sections of the insulating films 2, thereby enabling the side surfaces of the insulating films 2 to be firmly attached to the encapsulating resin 5. Accordingly, an interface separation does not occur easily between the insulating film 2 and the encapsulating resin 5, and, if it should occur, such a separation cannot develop along the side surfaces of the insulating film 2, thus preventing the generation of resin cracks in the end sections of the insulating film 2.

Figure 6:
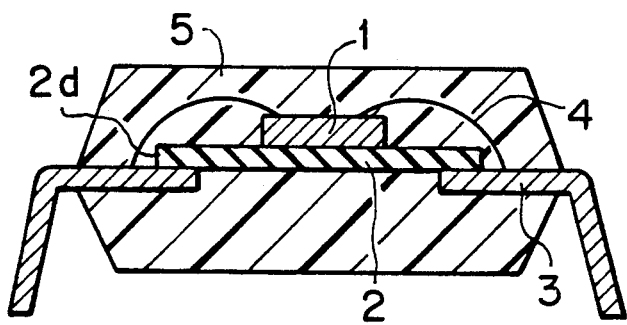
Figure 7:
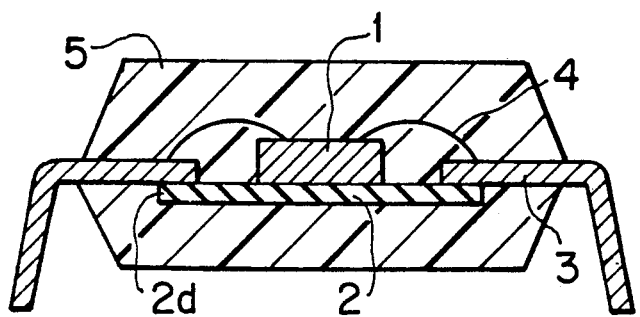

While the above description has been made with reference to the case where the leads are secured to the semiconductor element through the insulating films, that is, where the leads extend to the upper or the lower surface of the semiconductor element, this invention is also applicable to a plastic encapsulated semiconductor device in which, as shown, for example, in the sectional views of FIGS. 6 and 7, the semiconductor element (or chip) 1 is mounted on the insulating film 2, which, in turn, is supported by leads 3 arranged around the semiconductor element 1. Also in this case, this invention provides the effect of preventing the generation of resin cracks in the end sections 2d of the insulating film, as in the case of the above-described structures.

Figure 8:
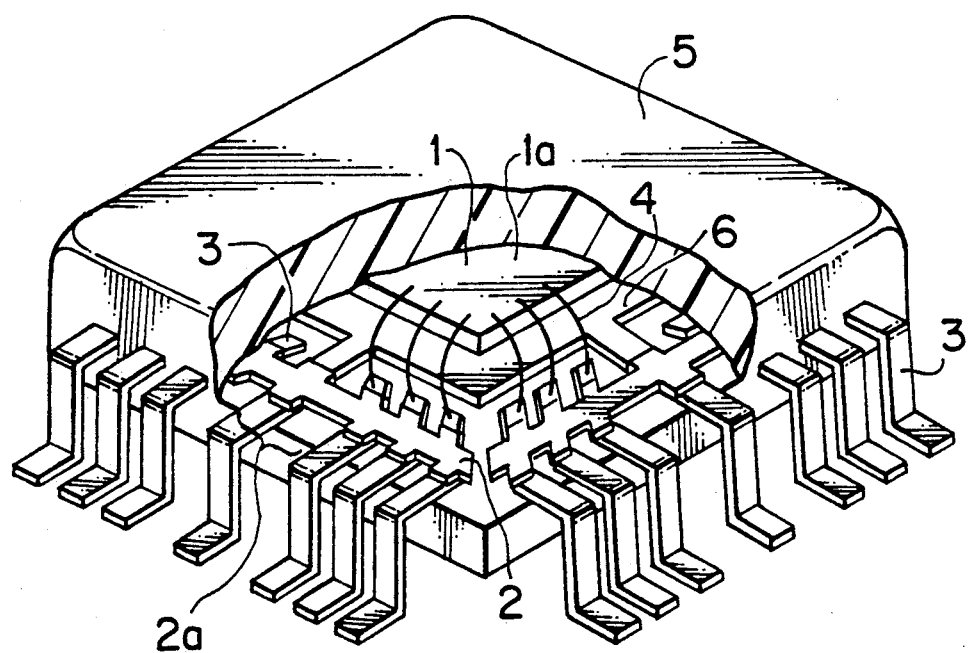
Figure 9:
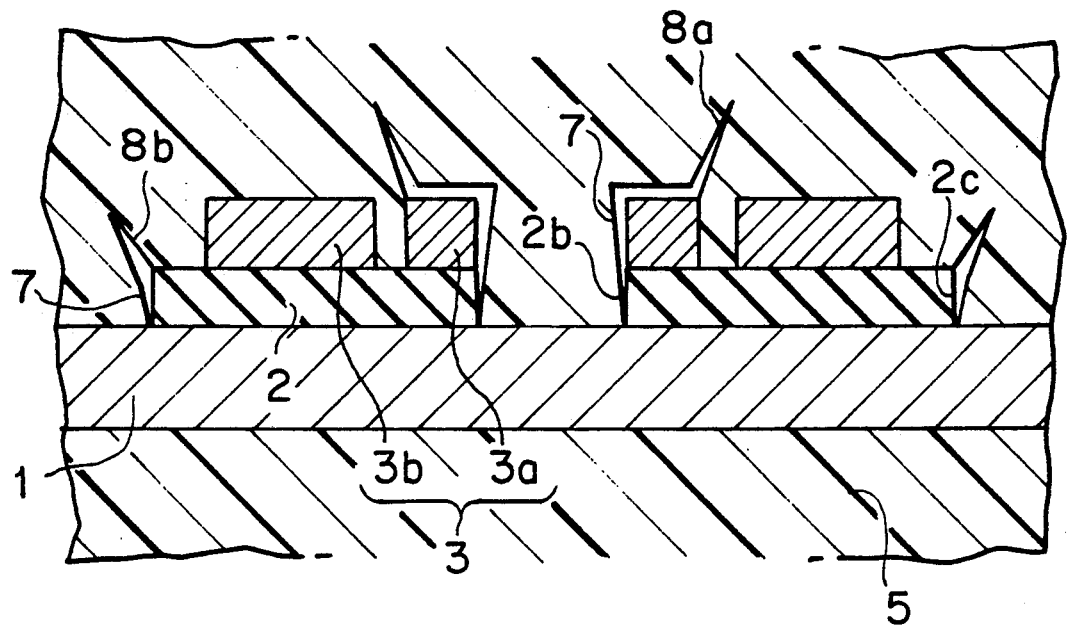
FIG. 9 is a local sectional view illustrating a resin crack generation mechanism.
Figure 10:
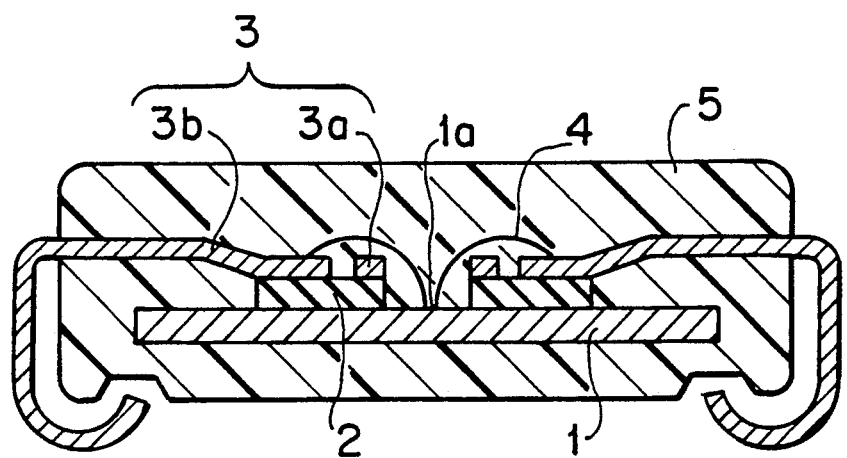
FIG. 10 is a sectional view showing an example of a conventional lead-on-chip-type plastic encapsulated semiconductor device.

FIG. 8 is a partially cutaway perspective view of an embodiment of this invention as applied to a conventional plastic encapsulated semiconductor device of the type using a tab; the structure of this invention is adopted here for the purpose of securing the leads in position prior to resin molding. In this embodiment, a plurality of leads 3 are glued to a common insulating film 2 and are connected to each other. By using the insulating film 2 in this manner, any deformation of the leads 3 during assembling of the semiconductor device can be avoided. Also in a plastic encapsulated semiconductor device of this structure, the generation of resin cracks in the end sections of the insulating film can be prevented by providing uneven surfaces, such as recessed surfaces 2a on the side surfaces of the insulating film 2. While, in the example of FIG. 8, the pitch of the plurality of leads 3 agrees with that of the uneven portions 2a, this should not be construed as restrictive. The pitches may disagree with each other. Further, it is expedient to make the pitch of the uneven portions 2a smaller than that of the leads.

In accordance with this invention, no serious interface separation occurs by thermal stress, so that the generation of resin cracks can be avoided, whereby it is possible to obtain a plastic encapsulated semiconductor device of a high level of reliability which allows mounting the largest semiconductor element (or chip) possible within limited outside dimensions.

What is claimed is:

1. A plastic encapsulated semiconductor device comprising: a semiconductor element; a plurality of leads electrically connected with said semiconductor element; one or more of insulating members respectively provided, in an overlapping manner, between said semiconductor element and said plurality of leads and are extended to cover only a limited portion of a main surface area of said semiconductor element; and an encapsulating resin covering a part of said plurality of leads, said insulating members and said semiconductor element, wherein at least a part of peripheral edge surfaces of at least one of said insulating members includes uneven surfaces.

2. A plastic encapsulated semiconductor device comprising: a semiconductor element including a circuit forming main surface; at least two insulating members glued to the circuit forming main surface of said semiconductor element and extended to cover only a limited portion of the main surface; at least two first leads for electrical connection with said semiconductor element respectively including inner lead portions having main parts arranged on said insulating members so as to extend in a direction parallel to the peripheral edge surfaces of said insulating members and so as to be opposed to each other; a plurality of second leads arranged on said insulating members at positions spaced away from said first leads; and an encapsulating resin encasing a part of said first and second leads respectively corresponding to inner lead portions thereof, said semiconductor element and said insulating members, wherein at least a part of the peripheral edge surfaces of at least one of said insulating members includes uneven surfaces.

3. A plastic encapsulated semiconductor device according to claim 2, wherein said uneven surfaces include recesses provided at least on a part of a peripheral edge surface of one of said at least two insulating members, said peripheral edge surface which has recesses on at least a part thereof is disposed near one of said first leads and positionally opposed to the other first lead.

4. A plastic encapsulated semiconductor device comprising: a semiconductor element having a front facing main surface and a rear facing surface; one or more of insulating members fixedly disposed in an overlapping manner, over a limited portion of said semiconductor element, between the rear facing surface of said semiconductor element and a plurality of leads, said plurality of leads being electrically connected with said semiconductor element; and an encapsulating resin encasing a part of said leads, said insulating members and said semiconductor element, wherein at least a part of peripheral edge surfaces of at least one of said insulating members includes uneven surfaces.

5. A plastic encapsulated semiconductor device according to one of claims 2, 3 and 4 wherein said uneven surfaces are comprised of recesses each of which is dimensioned to have an outer opening width smaller than that of a maximum width of an inner portion thereof.

6. A plastic encapsulated semiconductor device according to one of claims 2, 3 and 5 wherein said uneven surfaces are comprised of indentations on a roughened surface.

7. A plastic encapsulated semiconductor device according to one of claims 2, 3 and 5 wherein said uneven surfaces include recesses each having a rounded portion.

8. A plastic encapsulated semiconductor device according to claim 5, wherein each recess includes a rounded portion.

9. A plastic encapsulated semiconductor device according to one of claims 2, 3 and 5, wherein said uneven surfaces are comprised of recesses which are respectively extended to include an entire surface width, corresponding to thickness of said insulating member.

10. A plastic encapsulated semiconductor device according to claim 9, wherein said recesses are provided throughout each of the peripheral edges of each one of said insulating members.

11. A plastic encapsulated semiconductor device according to one of claims 3 and 5, wherein said semiconductor element is a rectangular-shaped semiconductor chip, and wherein said insulating members are rectangular-shaped and each is of a predetermined thickness.

12. A plastic encapsulated semiconductor device according to claim 11, wherein said uneven surfaces are comprised of recesses provided throughout each of the peripheral edges of each one of said insulating members.

13. A plastic encapsulated semiconductor device according to claim 1, wherein said semiconductor element is a rectangular-shaped semiconductor chip, and wherein said insulating members are rectangular-shaped and each is of a predetermined thickness.

14. A plastic encapsulated semiconductor device according to claim 13, wherein said uneven surfaces are comprised of recesses provided throughout each of the peripheral edges of each one of said insulating members.

15. A plastic encapsulated semiconductor device according to claim 3, wherein said recesses are respectively extended to include an entire surface width, corresponding to thickness of said insulating member, of that part of each peripheral edge surface corresponding to said uneven surfaces.

* * * * *